United States Patent
Hopper et al.

(10) Patent No.: US 6,864,581 B1
(45) Date of Patent: *Mar. 8, 2005

(54) ETCHED METAL TRACE WITH REDUCED RF IMPENDANCE RESULTING FROM THE SKIN EFFECT

(75) Inventors: Peter J. Hopper, San Jose, CA (US); Peter Johnson, Sunnyvale, CA (US); Kyuwoon Hwang, Palo Alto, CA (US); Michael Mian, Livermore, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/219,212

(22) Filed: Aug. 15, 2002

(51) Int. Cl.[7] .............................................. H01L 23/48
(52) U.S. Cl. ........................ 257/758; 257/750; 257/774
(58) Field of Search .............................. 257/750, 758, 257/774

(56) References Cited

U.S. PATENT DOCUMENTS

| | | | | |
|---|---|---|---|---|
| 3,573,540 A | * | 4/1971 | Osepchuk | 315/3.6 |
| 4,165,558 A | * | 8/1979 | Armitage, Jr. et al. | 29/590 |
| 5,434,094 A | * | 7/1995 | Kobiki et al. | 148/DIG. 28 |
| 5,952,704 A | * | 9/1999 | Yu et al. | 257/531 |
| 5,998,299 A | * | 12/1999 | Krishnan | 438/694 |
| 6,191,023 B1 | | 2/2001 | Chen | 438/612 |
| 6,326,673 B1 | | 12/2001 | Liou | 257/531 |
| 6,362,012 B1 | | 3/2002 | Chi et al. | 438/3 |
| 6,444,517 B1 | * | 9/2002 | Hsu et al. | 438/238 |
| 6,703,710 B1 | * | 3/2004 | Hopper et al. | 257/758 |

* cited by examiner

*Primary Examiner*—Jasmine Clark
(74) *Attorney, Agent, or Firm*—Mark C. Pickering

(57) ABSTRACT

The RF impedance of a metal trace at gigahertz frequencies is reduced by forming the metal trace to have a base region and a number of fingers that extend away from the base region. When formed to have a number of loops, the metal trace forms an inductor with an increased Q.

13 Claims, 6 Drawing Sheets

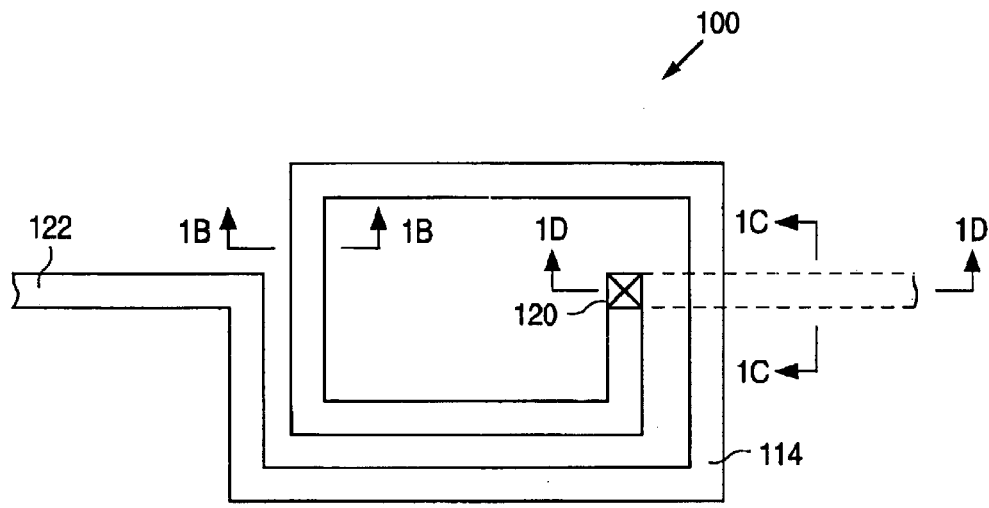
FIG. 1A
(PRIOR ART)
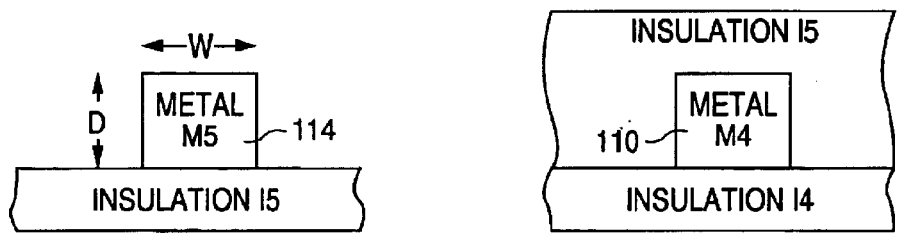
FIG. 1B
(PRIOR ART)
FIG. 1C
(PRIOR ART)
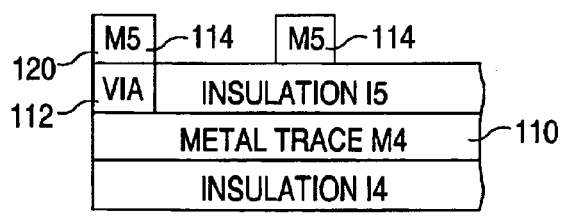
FIG. 1D
(PRIOR ART)

US 6,864,581 B1

ETCHED METAL TRACE WITH REDUCED RF IMPENDANCE RESULTING FROM THE SKIN EFFECT

RELATED APPLICATION

The present invention is related to application Ser. No. 10/219,791 for "Dual Damascene Metal Trace with Reduced RF Impedance Resulting from the Skin Effect" by Peter J. Hopper et al., application Ser. No. 10/219,896 for "Metal Trace with Reduced RF Impedance Resulting from the Skin Effect" by Peter J. Hopper et al., and application Ser. No. 10/219,235 for "Conductive Trace with Reduced RF Impedance Resulting from the Skin Effect" by Peter J. Hopper et al., all filed on an even date herewith.

BACKGROUND OF THE INVENTION

1. Field of the Invention

The present invention relates to metal traces and, more particularly, to an etched metal trace with reduced RF impedance resulting from the skin effect.

2. Description of the Related Art

Metal traces are common integrated circuit elements that are used in a multi-level interconnect structure to connect together various elements of a circuit. In addition, a metal trace can be used to form an integrated circuit inductor by forming the trace to have a number of coils or loops. Inductors are common circuit elements in radio frequency (RF) applications, such as digital cellular telephones.

FIG. 1A shows a plan view that illustrates a prior art integrated circuit inductor 100. FIG. 1B shows a cross-sectional view taken along lines 1B—1B of FIG. 1A. FIG. 1C shows a cross-sectional view taken along lines 1C—1C of FIG. 1A. FIG. 1D shows a cross-sectional view taken along lines 1D—1D of FIG. 1A.

As shown in FIGS. 1A–1D, inductor 100 is formed on top of a four metal layer interconnect structure that includes a fourth layer of insulation material I4, and a metal trace 110 that is formed on insulation layer I4 from a fourth metal layer M4. In addition, the metal interconnect structure includes a fifth layer of insulation material I5 that is formed on metal trace 110, and a via 112 that is formed through insulation layer I5 to make an electrical connection with metal trace 110.

As further shown in FAGS. 1A–1D, inductor 100 includes a metal trace 114 that is formed on top of the fifth layer of insulation material I5 from a fifth metal layer M5. Metal trace 114, which has a width W and a depth D, has a first end 120 that is formed over via 112 to make an electrical connection with via 112, and a second end 122. Metal trace 114, which makes one and a half loops in the same plane, is typically formed on top of the metal interconnect structure to avoid inducing currents in the substrate.

One important measure of a metal trace is the RF impedance of the trace, which affects the quality factor or Q of an inductor formed from the metal trace. High Q inductors are desirable in a number of RF circuits, such as resonant circuits. The Q of an inductor is a measure of the ratio of magnetic energy stored in the inductor versus the total energy fed into the inductor, and is given by equation (EQ.) 1 as:

$$Q = \omega L / Z, \qquad \text{EQ. 1}$$

where ω is related to the frequency f of the signal applied to the inductor (ω=2(pi)(f)), L represents the inductance of the inductor, and Z represents the RF impedance of the inductor. (Impedance is the vector sum of resistance and reactance, and introduces a phase shift.) Thus, as indicated by EQ. 1, the smaller the impedance, the higher the Q of the inductor.

One problem with metal traces is that when gigahertz-frequency signals are placed on the trace, the skin effect causes current to flow primarily at the surface. This effectively increases the RF impedance of the trace which, in turn, lowers the Q of an inductor formed from the trace.

One common approach to reducing the impedance of an integrated circuit inductor is to increase the size of the metal trace. However, in integrated circuit applications, there are practical limitations to the size of the metal trace. As a result, there is a need for a metal trace with reduced RF impedance which, in turn, allows a high Q integrated circuit inductor to be realized from the trace.

SUMMARY OF THE INVENTION

The present invention provides a metal trace that has reduced RF impedance at gigahertz frequencies. When the metal trace is formed to have a number of loops, the looping metal trace forms an integrated circuit inductor, while the reduced RF impedance increases the Q of the inductor.

A semiconductor structure in accordance with the present invention includes a layer of insulation material that is formed over a semiconductor substrate. In addition, the semiconductor structure includes a metal trace that is formed in the layer of insulation material. The metal trace has a base region and a plurality of spaced-apart fingers that extend away from the base region. The metal trace can be formed to have a number of loops, and the loops can be formed to lie substantially in the same plane.

The present invention also includes a method of forming a semiconductor structure that includes the step of forming a layer of insulation material over a semiconductor substrate. The method further includes the steps of forming a layer of conductive material on the layer of insulation material, and etching the layer of conductive material to form a trace. The trace has a top surface. In addition, the method includes the step of etching the trace to form a number of slot openings in the top surface of the trace.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a plan view illustrating a prior art integrated circuit inductor 100. FIG. 1B is a cross-sectional view taken along lines 1B—1B of FIG. 1A. FIG. 1C is a cross-sectional view taken along lines 1C—1C of FIG. 1A. FIG. 1D is a cross-sectional view taken along lines 1D—1D of FIG. 1A.

FIG. 2A is a plan view, while FIG. 2B is a cross-sectional view taken along line 2B—2B of FIG. 2A.

FIG. 3A is a plan view, while FIG. 3B is a cross-sectional view taken along lines 3B—3B of FIG. 3A. FIG. 3C is a cross-sectional view taken along lines 3C—3C of FIG. 3A. FIG. 3D is a cross-sectional view taken along lines 3D—3D of FIG. 3A.

DETAILED DESCRIPTION OF THE INVENTION

Figure 2A:
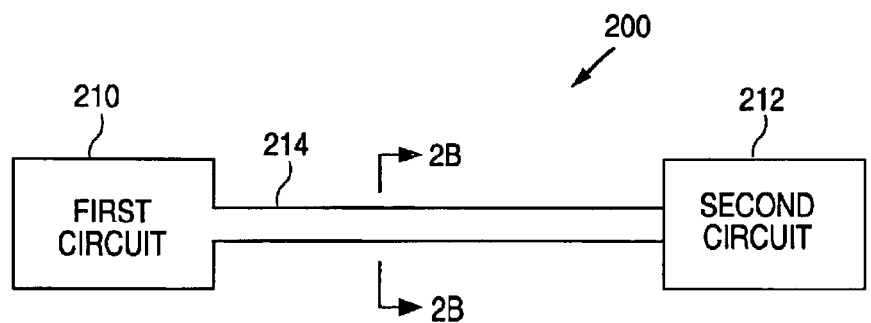
FIGS. 2A–2B are views illustrating an integrated circuit structure 200 in accordance with the present invention.
Figure 2B:
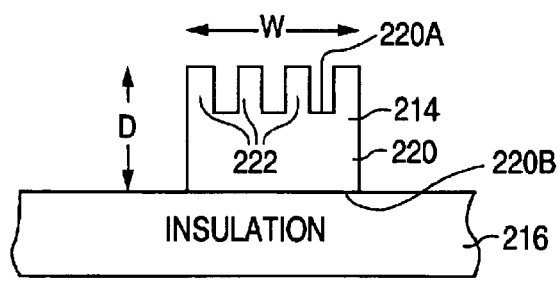

FIGS. 2A–2B show views that illustrate an integrated circuit structure 200 in accordance with the present invention. FIG. 2A shows a plan view, while FIG. 2B shows a cross-sectional view taken along line 2B—2B of FIG. 2A. As described in greater detail below, structure 200 utilizes a metal line that has been formed to have an increased surface area. The increased surface area, in turn, reduces the impedance of the line at gigahertz frequency levels.

As shown in FIGS. 2A–2B, structure 200 includes a first circuit 210 that operates on a gigahertz frequency signal, and a second circuit 212 that operates on a gigahertz frequency signal. In addition, structure 200 includes a metal trace 214 that is electrically connected to circuits 210 and 212. Metal trace 214, which is formed on a layer of insulation material 216, passes gigahertz frequency signals between circuits 210 and 212.

As further shown in FIG. 2B, metal trace 214 has a width W (of approximately four microns) and a depth D (of approximately four microns). Metal trace 214 also has a base region 220 with a top side 220A and a bottom side 220B, and a number of spaced-apart fingers 222 that extend away from top side 220A. Fingers 222, in turn, substantially increase the surface area of metal trace 214 when compared to a conventional metal trace that has the same width W and depth D, such as metal trace 114.

In operation, when a signal in the gigahertz frequency range is placed on metal trace 214 by circuit 210 or circuit 212, current flows primarily at the surface of metal trace 214 due to the skin effect. Thus, in accordance with the present invention, since current flows primarily at the surface and fingers 222 substantially increase the surface area of metal trace 214, fingers 222 allow more current to flow. As a result, fingers 222 effectively reduce the RF impedance of metal trace 214.

Thus, the present invention reduces the RF impedance of a metal trace that interconnects two gigahertz frequency devices. (The metal trace connecting together two gigahertz frequency devices can be formed from any one of the layers of metal used to form the metal interconnect structure, such as the first layer of metal, or a combination of metal layers and vias.)

Figure 3A:
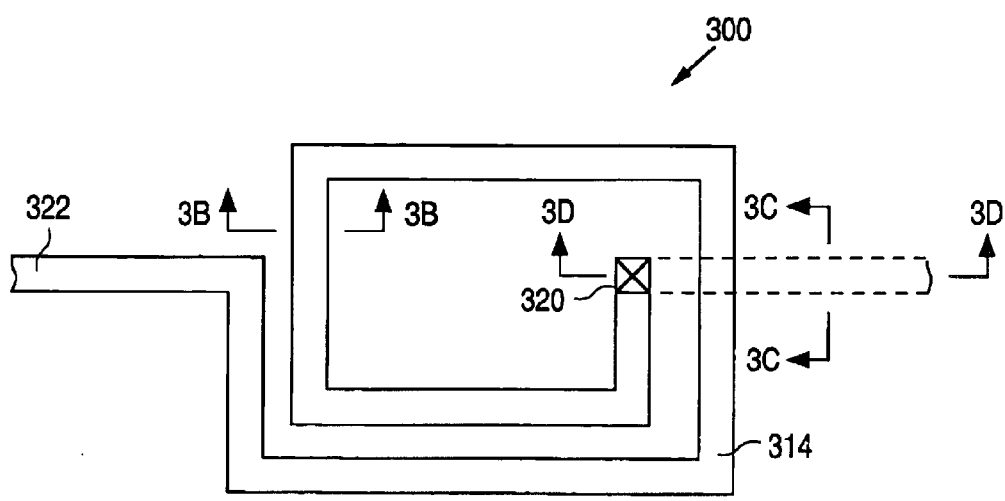
FIGS. 3A–3D are views illustrating an integrated circuit inductor 300 in accordance with the present invention.
Figure 3B:
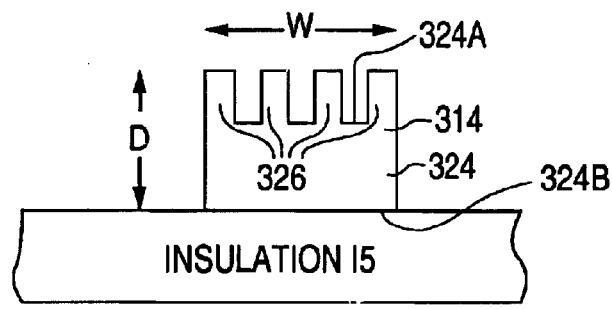
Figure 3C:
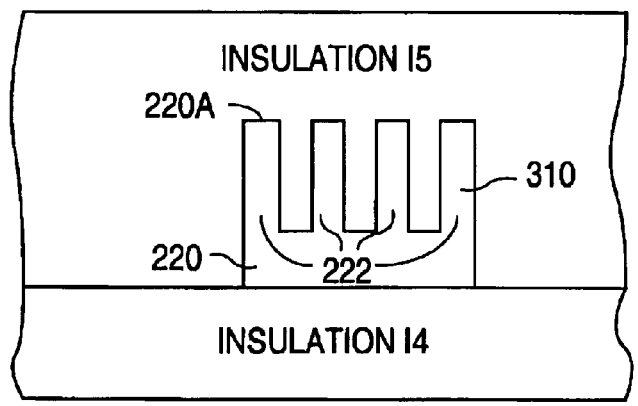
Figure 3D:
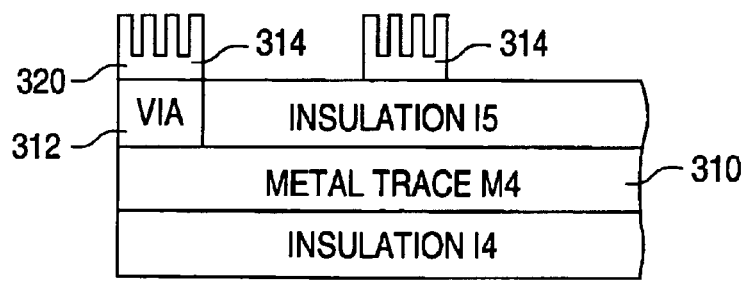

FIG. 3A shows a plan view that illustrates an example of an integrated circuit inductor 300 in accordance with the present invention. FIG. 3B shows a cross-sectional view taken along lines 3B—3B of FIG. 3A. FIG. 3C shows a cross-sectional view taken along lines 3C—3C of FIG. 3A. FIG. 3D shows a cross-sectional view taken along lines 3D—3D of FIG. 3A.

As described in greater detail below, inductor 300 is formed from a metal trace that has been formed to have an increased surface area. The increased surface area, in turn, reduces the RF impedance of the metal trace when gigahertz-frequency signals are placed on the trace. As a result, the metal trace of the present invention can be used to form integrated circuit inductors with an increased Q.

In the example shown in FIGS. 3A–3D, like inductor 100, inductor 300 is formed on top of a four metal layer interconnect structure. The interconnect structure includes a fourth layer of insulation material I4, and a metal trace 310 that is formed on insulation layer I4 from a fourth metal layer M4. In addition, the metal interconnect structure includes a fifth layer of insulation material I5 that is formed on metal trace 310, and a via 312 that is formed through insulation layer I5 to make an electrical connection with metal trace 310.

As further shown in FIGS. 3A–3D, inductor 300 includes a metal trace 314 that is formed on top of the fifth layer of insulation material I5 from a fifth metal layer M5. (Metal trace 314 can be formed from any metal layer, including the first metal layer. The fifth metal layer of the present example is but one possibility. By forming inductor 300 on top of a metal interconnect structure, however, induced substrate currents are minimized).

In addition, metal trace 314 has a first end 320 that is formed over via 312 to make an electrical connection with via 312, and a second end 322. (In this example, second end 322 can be connected to a via connected to a metal-4 trace, or a via connected to a pad or another overlying metal trace.)

Metal trace 314 also has a width W (of approximately four microns) and a depth D (of approximately four microns). Further, metal trace 314 makes one and a half loops in the same plane. (Trace 314 is not limited to one and a half loops, but can be formed with a different number of loops.)

As further shown in FIG. 3B, metal trace 314 has a base region 324 with a top side 324A and a bottom side 324B, and a number of spaced-apart fingers 326 that extend away from top side 324A. Fingers 326, in turn, substantially increase the surface area of metal trace 314 when compared to a conventional metal trace that has the same width W and depth D, such as metal trace 114.

In operation, when a signal in the gigahertz frequency range is input to inductor 300, current flows primarily at the surface of metal trace 314 due to the skin effect. Thus, in accordance with the present invention, since current flows primarily at the surface and fingers 326 substantially increase the surface area of metal trace 314, fingers 326 allow more current to flow.

As a result, fingers 326 effectively reduce the RF impedance of metal trace 314, thereby increasing the Q of inductor 300. In addition, as illustrated by FIG. 3C, metal trace 310 can be formed as metal trace 214, thereby providing a low RF impedance pathway from inductor 300 (a first gigahertz frequency device) to another gigahertz frequency device.

Figure 4A:
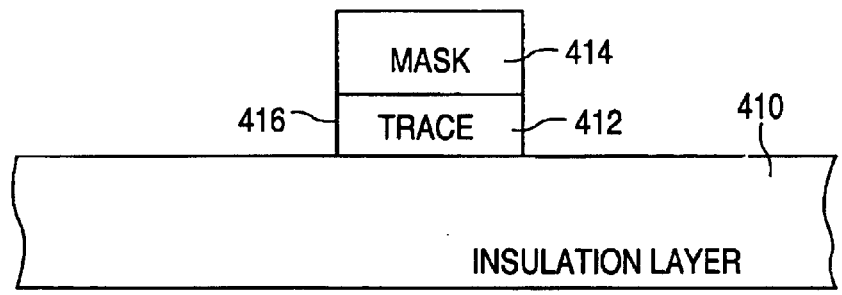
FIGS. 4A–4C are cross-sectional drawings illustrating an example of a method of forming a metal trace in accordance with the present invention.
Figure 4B:
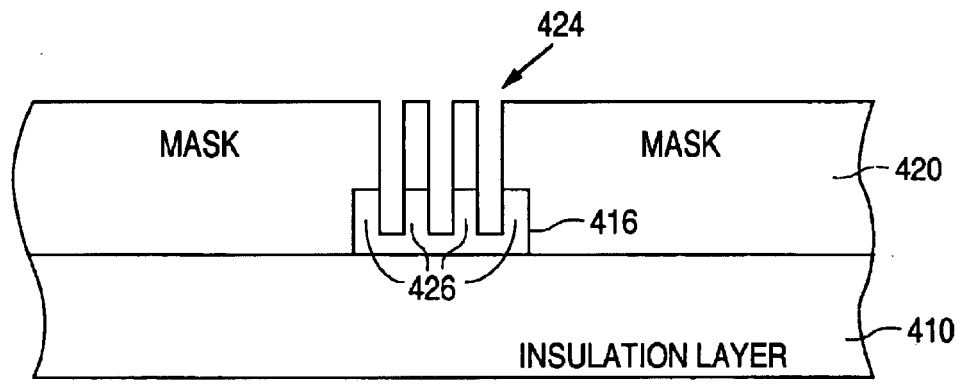
Figure 4C:
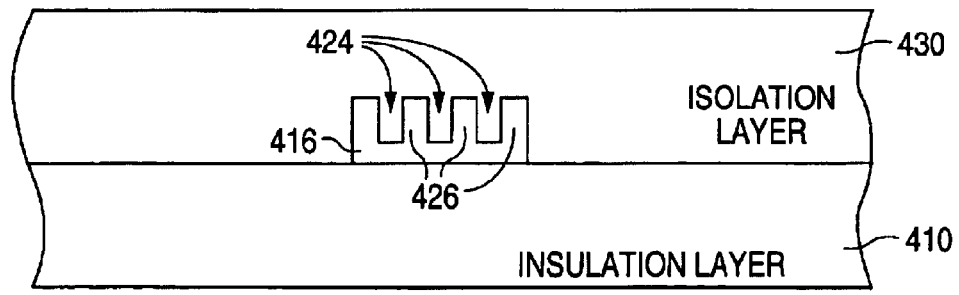

FIGS. 4A–4C show cross-sectional drawings that illustrate an example of a method of forming a metal trace in accordance with the present invention. As shown in FIG. 4A, the method utilizes a layer of insulation material 410 that has been formed over a semiconductor integrated circuit device. Insulation layer 410, in turn, has a number of contacts or vias that have been formed through insulation layer 410.

In addition, insulation layer 410 can be formed on the surface of the substrate of the device, or on top of a metal trace that is formed from any of the layers of metal that are used to form the metal interconnect structure of the device. For example, when a semiconductor integrated circuit is fabricated with a five layer metal process, insulation layer 410 can be formed on the metal-4 layer.

As further shown in FIG. 4A, the method of the present invention begins by forming a layer of conductive material 412, such as copper or aluminum, on insulation layer 410. After this, a layer of masking material 414 is formed and patterned on conductive layer 412. Next, the exposed regions of conductive layer 412 are etched to form a trace 416 on insulation layer 410.

Trace 416 can be formed to have a number of loops that lie substantially in the same plane, thereby forming an inductor. In addition, trace 416 can be connected to a contact or a via formed in insulation material 410. (Trace 416 can contact more than one contact or via, or no vias if an overlying metal layer and vias are used to make an electrical connection to trace 416). Once trace 416 has been formed, mask 414 is removed.

After this, as shown in FIG. 4B, a layer of masking material 420 is formed on insulation layer 410 and trace 416. Masking material 420, which can be implemented with a soft mask material (photoresist) or a hard mask material (nitride), is then patterned to expose regions on the surface of trace 416. Next, the exposed regions of trace 416 are anisotropically etched to form a number of slot openings 424 in trace 416. Slot openings 424, in turn, define a number of fingers 426.

Following this, as shown in FIG. 4C, mask 420 is removed and a layer of isolation material 430 is formed on insulation layer 410 and trace 416 to fill up slot openings 424. After isolation layer 430 has been formed, the method continues with conventional steps.

Figure 5:
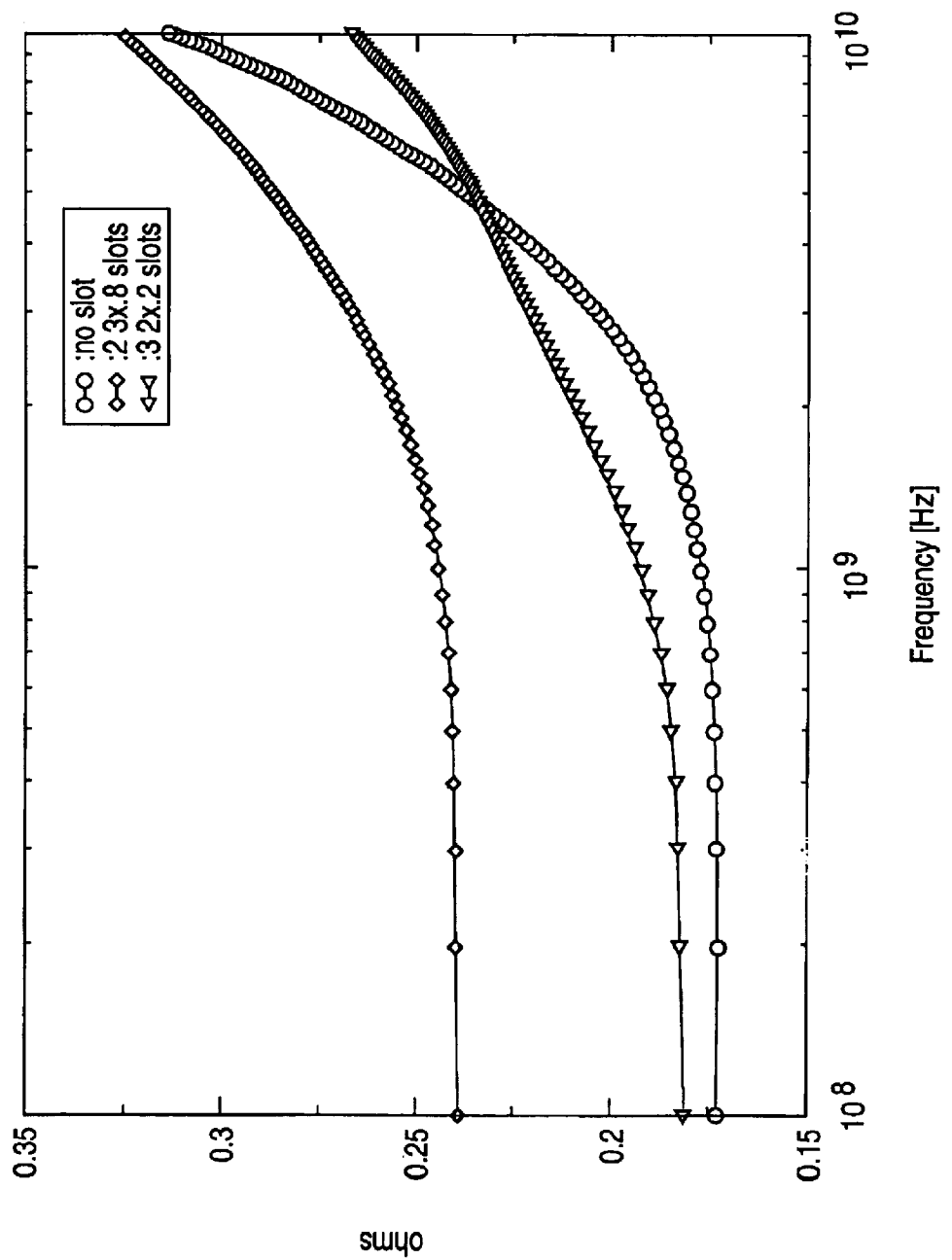
FIG. 5 is a graph illustrating the RF impedance of three metal traces in accordance with the present invention.

FIG. 5 shows a graph that illustrates the RF impedances of three metal traces in accordance with the present invention. As shown in FIG. 5, the line of circles represent a conventional square metal trace, while the line of diamonds represent a metal trace in accordance with the present invention that has two slot openings. Each slot opening, in turn, has a depth of three microns and a width of 0.8 microns. Further, the line of triangles represent a metal trace in accordance with the present invention that has three slot openings that each have a depth of two microns and a width of 0.2 microns.

As further shown in FIG. 5, a conventional metal trace with a square/rectangular shape and no slot openings provides a lower impedance up to about five gigahertz. However, for frequencies greater than five gigahertz, a metal trace with three slot openings provides a lower impedance.

Figure 6:
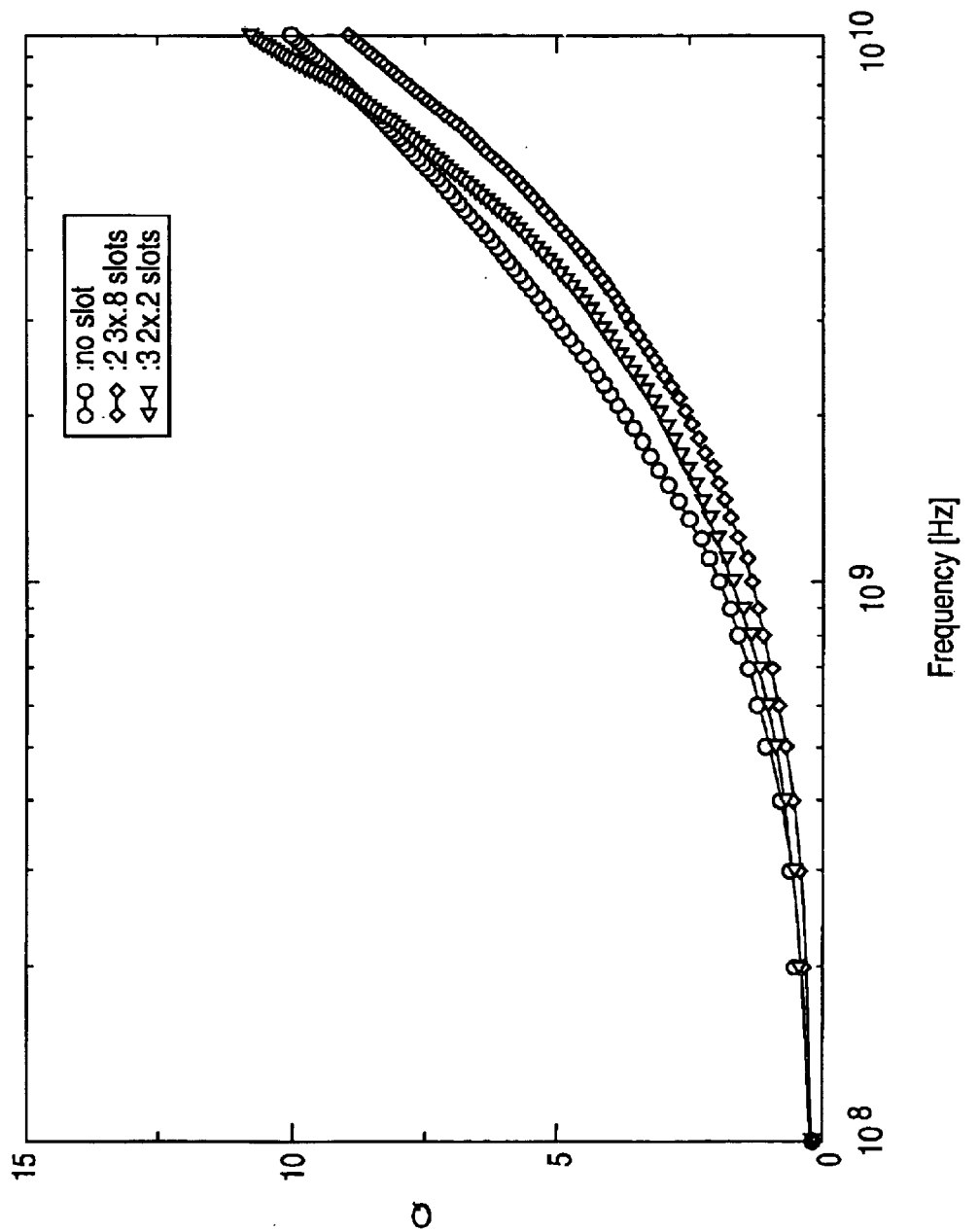
FIG. 6 is a graph illustrating the Q of three planar inductors in accordance with the present invention.

FIG. 6 shows a graph that illustrates the Q of three planar inductors in accordance with the present invention. As shown in FIG. 6, the line of circles represent a planar inductor with a conventional square metal trace, while the line of diamonds represent an inductor formed from a metal trace in accordance with the present invention that has two slot openings. Each slot opening, in turn, has a depth of three microns and a depth of 0.8 microns.

Further, the line of triangles represent an inductor formed from a metal trace in accordance with the present invention that has three slot openings that are each two microns deep and 0.2 microns wide. As shown in FIG. 6, a metal trace with three slot openings provides a higher Q when signals with a frequency greater than about 7 gigahertz are applied.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor device comprising:
   a layer of insulation material formed over a semiconductor substrate; and
   a metal trace formed in the layer of insulation material, the metal trace having a base region and a plurality of spaced-apart fingers that extend away from the base region.

2. The semiconductor device of claim 1 wherein the metal trace has a first end electrically connected to a first circuit, and a second end electrically connected to a second circuit, the metal trace passing a gigahertz-frequency signal from the first circuit to the second circuit.

3. The semiconductor device of claim 2 wherein the metal trace lies substantially in a plane horizontal to a surface of the substrate.

4. The semiconductor device of claim 2 wherein the fingers extend away from a top surface of the base region.

5. The semiconductor device of claim 2 wherein the metal trace is connected to a contact.

6. The semiconductor device of claim 2 wherein the metal trace is connected to a via.

7. The semiconductor device of claim 1 wherein the metal trace forms a number of loops.

8. The semiconductor device of claim 7 wherein the loops lie substantially in a same plane.

9. The semiconductor device of claim 7 wherein the metal trace has a first end and a second end.

10. The semiconductor device of claim 9 wherein the second end is connected to a contact.

11. The semiconductor device of claim 9 wherein the second end is connected to a via.

12. The semiconductor device of claim 11 wherein the via lies under the metal trace.

13. The semiconductor device of claim 7 wherein the fingers extend away from a top surface of the base region.

* * * * *

UNITED STATES PATENT AND TRADEMARK OFFICE
CERTIFICATE OF CORRECTION

PATENT NO.    : 6,864,581 B1
DATED         : March 8, 2005
INVENTOR(S)   : Hopper et al.

It is certified that error appears in the above-identified patent and that said Letters Patent is hereby corrected as shown below:

<u>Title page, Item [54], and Column 1, line 2,</u>
Title, delete "IMPENDANCE" and insert -- IMPEDANCE --.

<u>Column 1,</u>
Line 46, delete "FAGS." and replace weith -- FIGS. --.

Signed and Sealed this

Twenty-fourth Day of May, 2005

JON W. DUDAS
*Director of the United States Patent and Trademark Office*